United States Patent [19]

Uehara et al.

[11] Patent Number: 4,592,625
[45] Date of Patent: Jun. 3, 1986

[54] DOUBLE-CONJUGATE MAINTAINING OPTICAL SYSTEM

[75] Inventors: Makoto Uehara, Tokyo; Satoru Anzai, Zama; Kyoichi Suwa, Kawasaki, all of Japan

[73] Assignee: Nippon Kogaku K. K., Tokyo, Japan

[21] Appl. No.: 469,015

[22] Filed: Feb. 23, 1983

[30] Foreign Application Priority Data

Mar. 4, 1982 [JP] Japan .................................. 57-34366

[51] Int. Cl.$^4$ ..................... G01B 11/00; G02B 13/22
[52] U.S. Cl. ...................................... 350/415; 356/401
[58] Field of Search ................. 350/415, 425, 450; 356/401

[56] References Cited

U.S. PATENT DOCUMENTS 4,318,585  3/1982  Matsumura .................... 350/46
4,386,828  6/1983  Hirose ....................... 350/415 X

*Primary Examiner*—John K. Corbin
*Assistant Examiner*—Scott J. Sugarman
*Attorney, Agent, or Firm*—Shapiro and Shapiro

[57] ABSTRACT

A double-conjugate maintaining optical system for maintaining the conjugate relation between an object and its image even if the distance between the object and the image varies and also maintaining another set of conjugate relation in a predetermined condition includes an afocal system comprising a plurality of lens units, a first positive lens unit disposed on the object side of the afocal system, and a second positive lens unit disposed on the image side of the afocal system. The first positive lens unit is movable relative to the second positive lens unit so that the object is positioned on the focal plane of the first positive lens unit opposite to the afocal system. The afocal system is movable along the optical axis thereof in a predetermined relation with the first positive lens unit.

22 Claims, 27 Drawing Figures

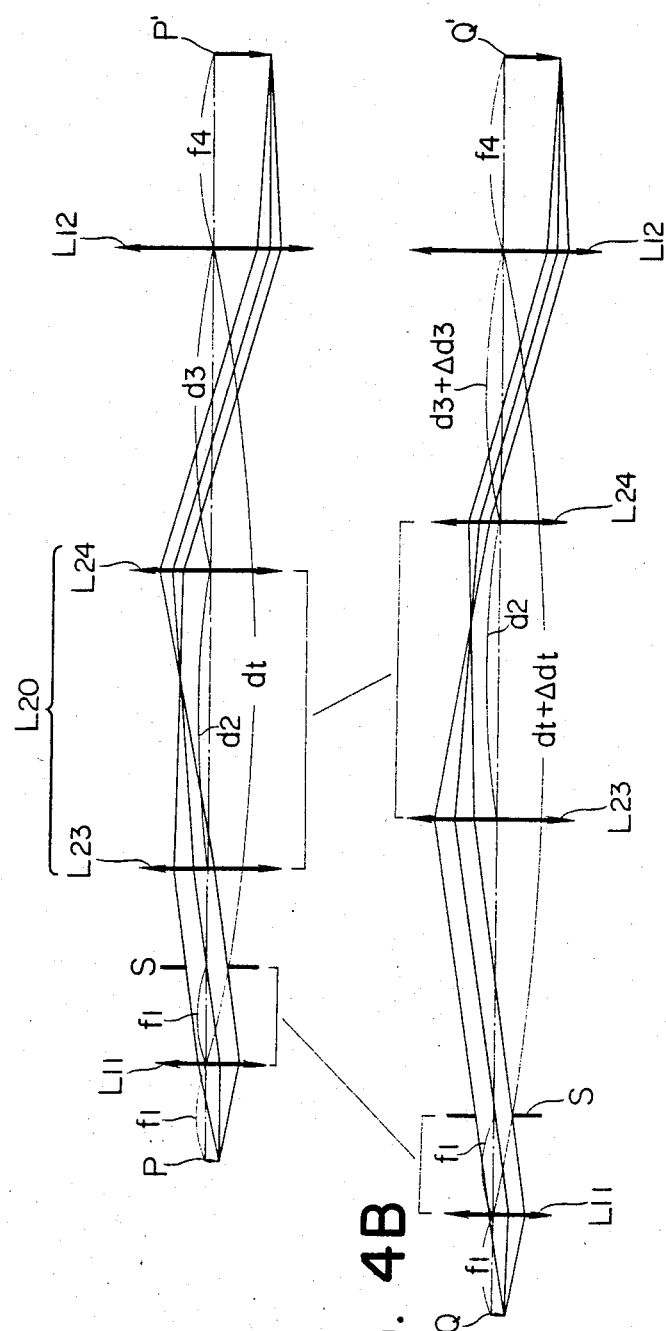

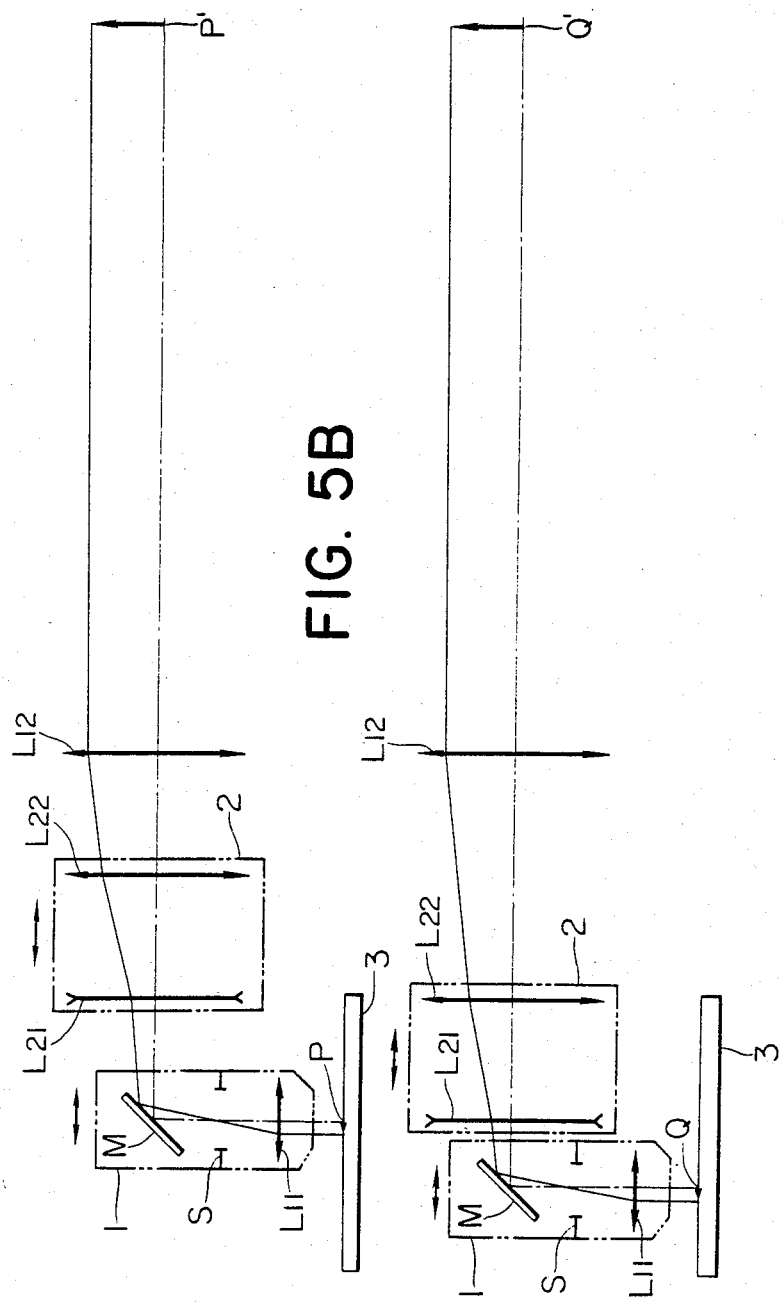

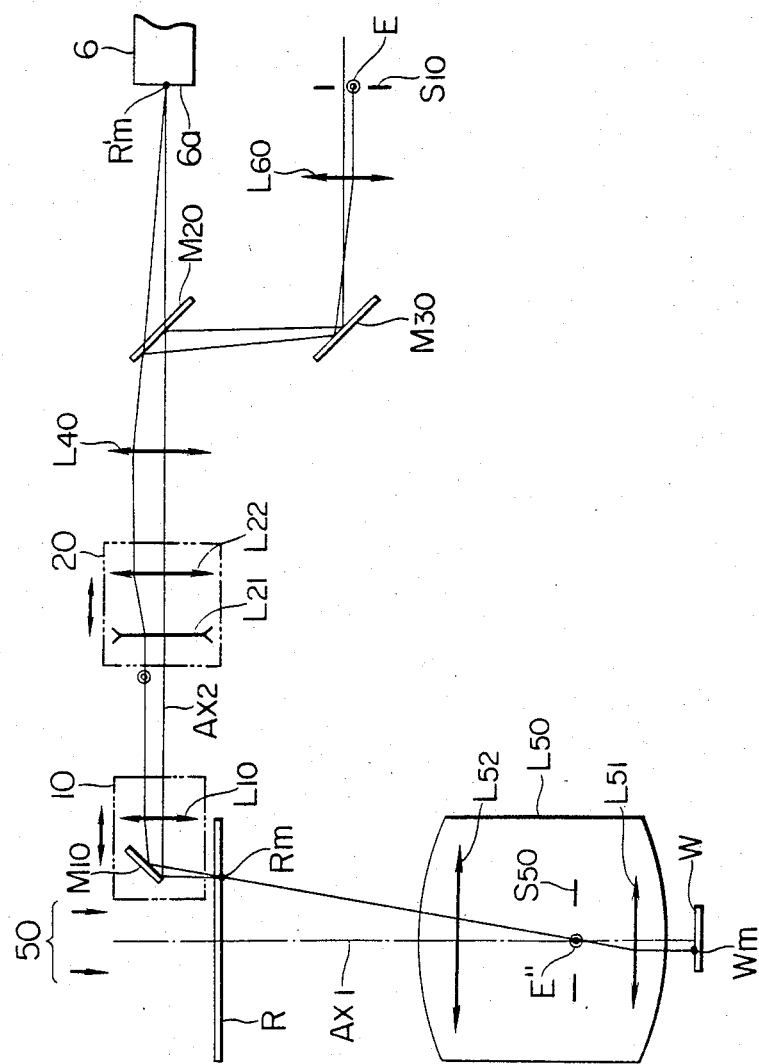

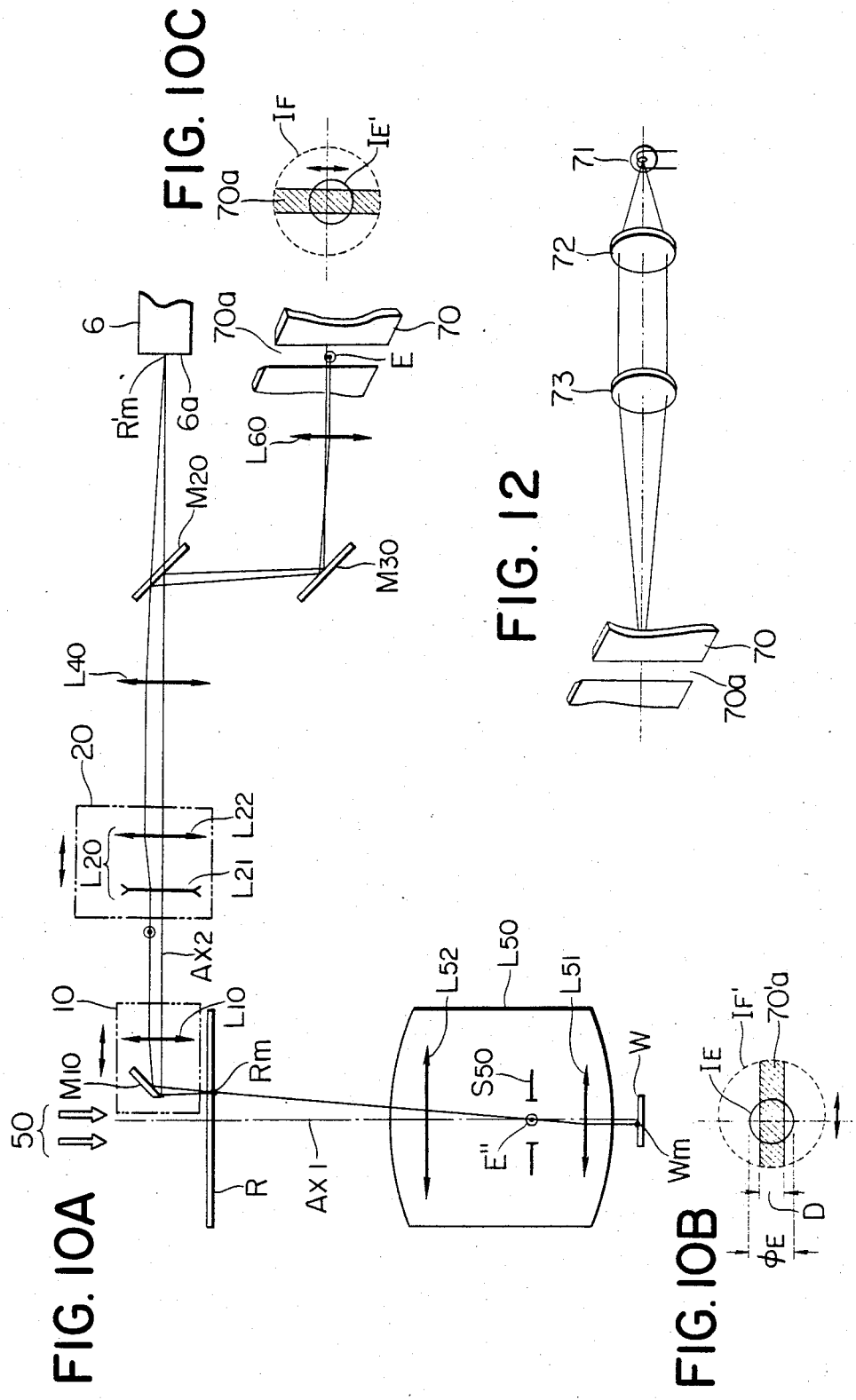

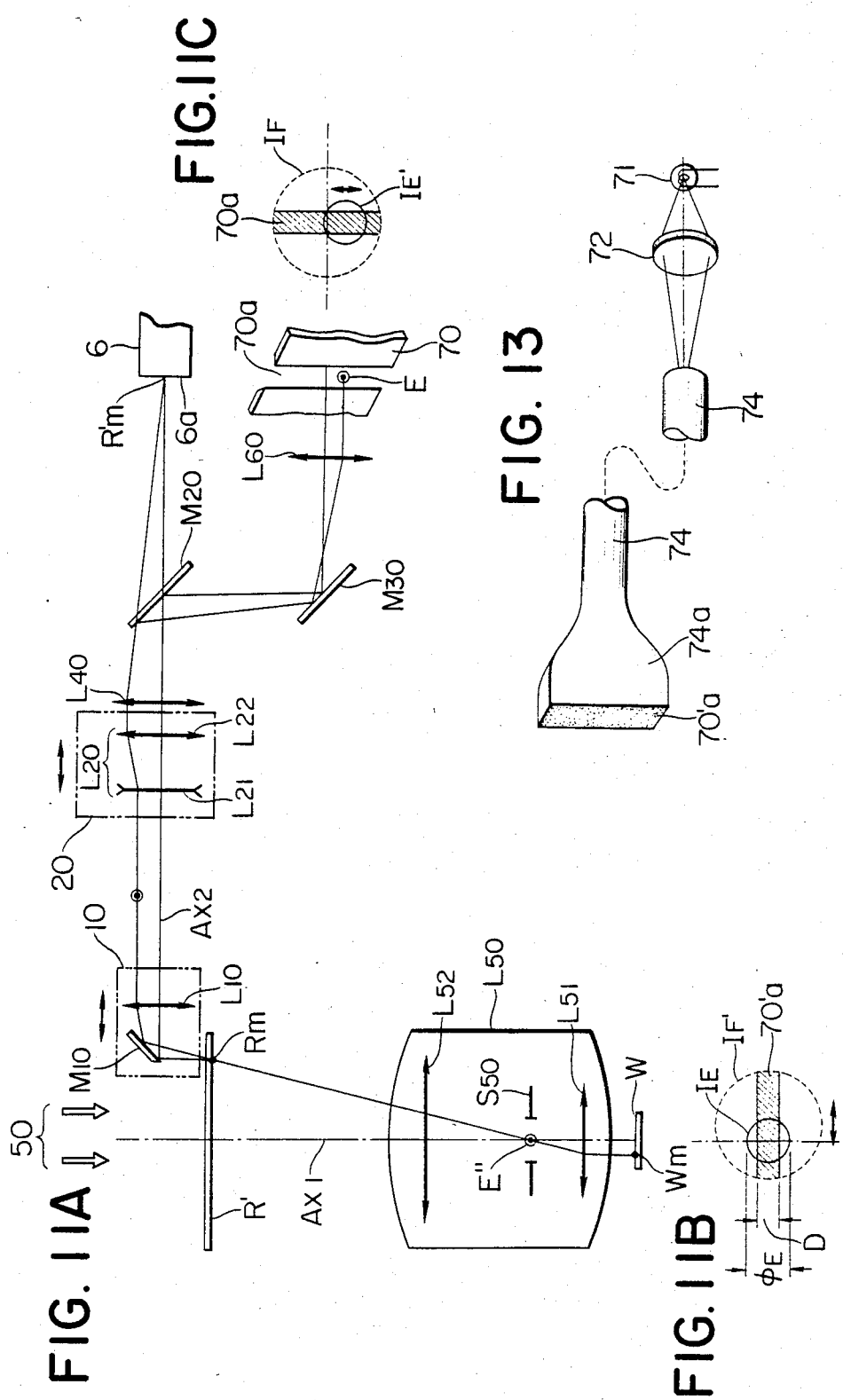

DOUBLE-CONJUGATE MAINTAINING OPTICAL SYSTEM

BACKGROUND OF THE INVENTION

1. Field of the Invention

This invention relates to improvements in an optical system capable of maintaining the position of an object or its image constant even if the distance between the object and the image varies and also relates to applications thereof.

2. Description of the Prior Art

An optical system is known in which the system between two lenses is constructed into a parallel optical system and the distance between an object and its image can be changed by moving the two lenses relative to each other. That is, as shown in FIGS. 1A and 1B of the accompanying drawings, if an object P is disposed on the forward focus of a first positive lens $L_{01}$, the image P′ of the object P is formed on the rearward focus of a second positive lens $L_{02}$ and, if the distance between the two lenses is changed, the distance between the object P and the image P′ can be changed arbitrarily. The image magnification is a predetermined value determined by the ratio of the focal lengths of the two lenses, and it is also well known that the position of the object or the image can be fixed if only one of the lenses is moved. In such optical system, however, when the spacing between the two lenses is equal to the sum $(f_1+f_2)$ of the focal lengths of the two lenses as shown in FIG. 1A, a light ray parallel to the optical axis which enters the second positive lens $L_{02}$ from the image P′ side is still parallel to the optical axis, as indicated by broken line in the Figure, even after it leaves the firt positive lens $L_{01}$, whereby so-called telecentricity is maintained on both sides, whereas if the spacing between the two lenses changes as shown in FIG. 1B, the telecentricity on the object P side can no longer be maintained. That is, although the distance between the object and the image can be changed arbitrarily by changing the spacing between the two lenses, the conjugate relation of the pupil of this optical system cannot be maintained constant. Accordingly, it is only for a particular spacing between the two lenses that a telecentric illuminating light can be supplied where the object P is to be coaxially illuminated, and in the other cases, telecentric illumination, i.e., Keller illumination, could not be accomplished unless the light source itself was moved.

SUMMARY OF THE INVENTION

It is an object of the present invention to provide a double-conjugate maintaining optical system which is capable of maintaining the conjugate relation between an object and its image by movement of a certain lens even if the distance between the object and the image varies and also maintaining constant the conjugate relation regarding another particular point called the pupil position.

It is a further object of the present invention to provide an optical system in which telecentricity is always maintained on both sides even if the distance between the object and its image varies, and an excellent optical system which is capable of always maintaining complete Keller illumination.

A double-conjugate maintaining optical system in accordance with the present invention has an afocal system comprising a plurality of lens units, and two positive lens units coaxially disposed on the opposite sides of the afocal system. One of the two positive lens units and the afocal system are movable along the optical axis and, when the distance between an object conjugate with respect to the optical system and its image varies, the movable positive lens unit and the afocal system are operatively associated with each other in a predetermined relation, whereby two sets of conjugate relations are maintained. That is, according to the present invention, even if the distance between the object and its image varies, the conjugate relation between the two can be maintained by movement of a certain lens unit and the conjugate relation of the pupil can also be maintained in a predetermined condition. Accordingly, objects at different positions can be observed or measured at a predetermined position while telecentricity is being maintained and further, even if the positions of the objects vary, complete Keller illumination can be maintained.

The invention will become more fully apparent from the following detailed description thereof taken in conjunction with the accompanying drawings.

BRIEF DESCRIPTION OF THE DRAWINGS

FIGS. 3A and 3B, 4A and 4B, 5A and 5B, 6A and 6B, 7A and 7B, 8 and 9 show the constructions of a first, a second, a third, a fourth, a fifth, a sixth and a seventh embodiment, respectively, of the present invention.

FIGS. 10A and 11A schematically shows the construction of an eighth embodiment of the present invention.

FIGS. 10B and 11B illustrate the entrance pupil of a projection objective lens.

FIGS. 10C and 11C illustrate the opening surface of a light source portion.

FIGS. 12 and 13 are perspective views showing specific embodiments of light source means.

DESCRIPTION OF THE PREFERRED EMBODIMENTS

Figure 1A:
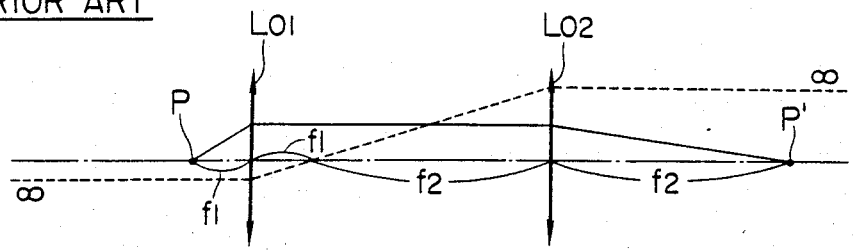
FIGS. 1A and 1B show the construction of an optical system according to the prior art.
Figure 1B:
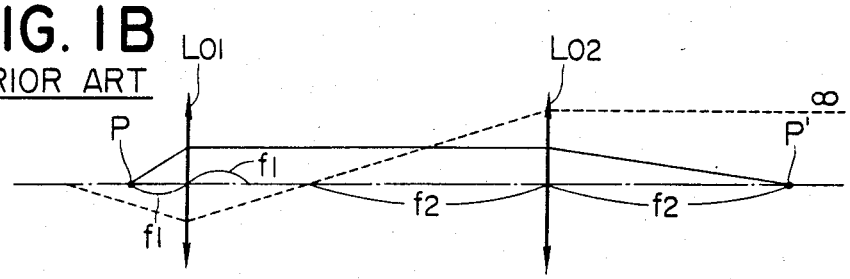
Figure 2A:
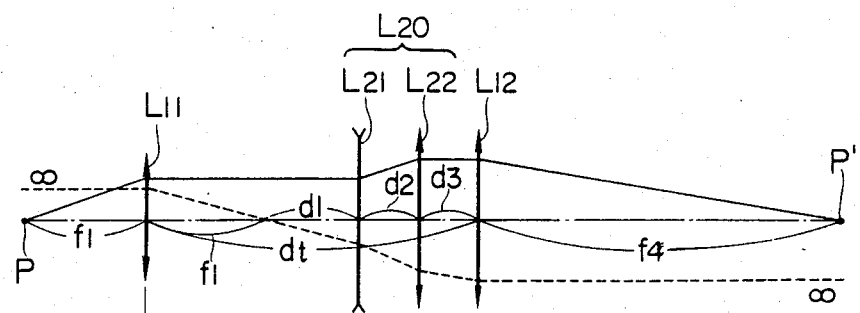
FIGS. 2A and 2B illustrate the principle of the construction of the present invention.
Figure 2B:
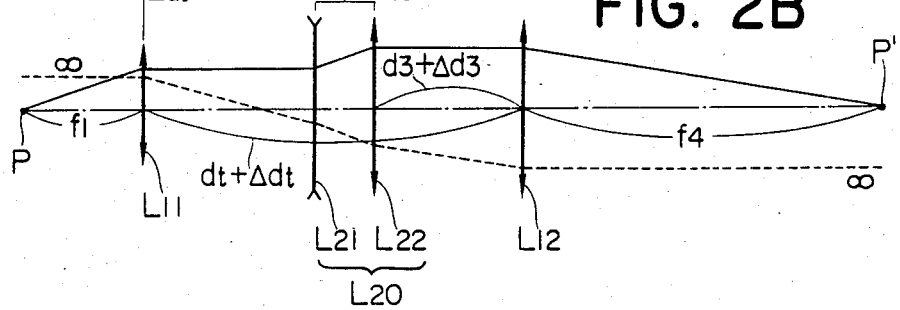

The present invention will hereinafter be described by reference to the drawings. FIGS. 2A and 2B show the basic construction of the present invention. Between a first positive lens unit $L_{11}$ and a second positive lens unit $L_{12}$, there is disposed an afocal system $L_{20}$ comprising a negative lens unit $L_{21}$ and a positive lens unit $L_{22}$. The image P′ of an object P disposed on the forward focus of the first positive lens unit $L_{11}$ is formed on the rearward focus of the second positive lens unit $L_{12}$ because, as shown in solid line, the system between the first positive lens unit $L_{11}$ and the second positive lens unit $L_{12}$ is a parallel optical system. Assuming that the focal lengths of the first positive lens unit $L_{11}$, the negative lens unit $L_{21}$, the positive lens unit $L_{22}$ and the second positive lens unit $L_{12}$ are $f_1$, $f_2$, $f_3$ and $f_4$, respectively, that the distance between the first positive lens unit $L_{11}$ and the negative lens unit $L_{21}$ of the afocal system is $f_1+d_1$, that the distance between the negative lens unit $L_{21}$ and the positive lens unit $L_{22}$ which constitutes the afocal system is $d_2$ and that the distance between the positive lens unit $L_{22}$ in the afocal system and the second positive lens $L_{12}$ is $d_3$, and where the system is telecentric on both the object side and the image side, as shown by broken line in FIG. 2, the condition for which the whole of the four units is an afocal system is as follows:

$$d_1 = \frac{f_3^2 f_2 + f_2^2 f_4 + f_2^2 f_3}{f_3^2} - \frac{f_2^2}{f_3^2} d_3 \tag{1}$$

Assuming that the distance from the first positive lens unit $L_{11}$ to the second lens group $L_{12}$, i.e., the full length of the lens system, is dt, $$dt = f_1 + d_1 + d_2 + d_3 \tag{2}$$

$$= f_1 + \left\{ \frac{f_3^2 f_2 + f_2^2 f_4 + f_2^2 f_3}{f_3^2} + d_2 + d_3\left(1 - \frac{f_2^2}{f_3^2}\right) \right\}$$

and the condition for which the system is telecentric on both sides is expressed as equation (2). If this equation (2) is differentiated by $d_3$, there will be obtained $$\Delta dt = \left(1 - \frac{f_2^2}{f_3^2}\right) \Delta d_3 \tag{3}$$

and it is seen that $\Delta dt$ and $\Delta d_3$ are linear. That is, if the second positive lens unit $L_{12}$ is considered to be stationary, the amount of variation $\Delta dt$ in the full length dt of the lens system and the amount of movement $\Delta d_3$ of the afocal system $L_{20}$ are linear and, if the afocal system $L_{20}$ is moved while satisfying the relation of equation (3) when the first positive lens $L_{11}$ is moved, then the conditions of equations (1) and (2) will always be maintained. Accordingly, by making such a design that when the position of the object P changes, the first positive lens unit $L_{11}$ is moved by the same amount as the amount of movement of the object P to ensure that the object P be always located on the forward focus of the first positive lens unit and by operatively associating the afocal system $L_{20}$ so as to satisfy equation (3), it is possible to maintain the conjugate relation between the same object and its image while keeping the object image P' at a predetermined position and to always maintain telecentricity on the object side and the image side.

Let it be assumed that the magnification of this system is to be found. The combined focal length f of the afocal system $L_{20}$ and the second positive lens unit $L_{12}$ is $$f = -\frac{f_2 f_4}{f_3}$$

and therefore, by taking the ratio thereof to the focal length of the first positive lens unit $L_{11}$, the magnification $\beta$ of the entire system is given thus:

$$\beta = \frac{f_2 f_4}{f_1 f_3} \tag{4}$$

That is, the magnification is a function of only the focal length of each group and is constant independently of the distance between the object and its image.

Although, in FIG. 2, the focal system has been shown as a Galilean type comprising a negative lens unit and a positive lens unit, the order of the positive and negative may also be reversed and, of course, even in a Kepler type wherein the afocal system comprises two positive lens groups, the aforementioned equations (1) to (4) are established in a similar manner.

Figures 3A, 3B:
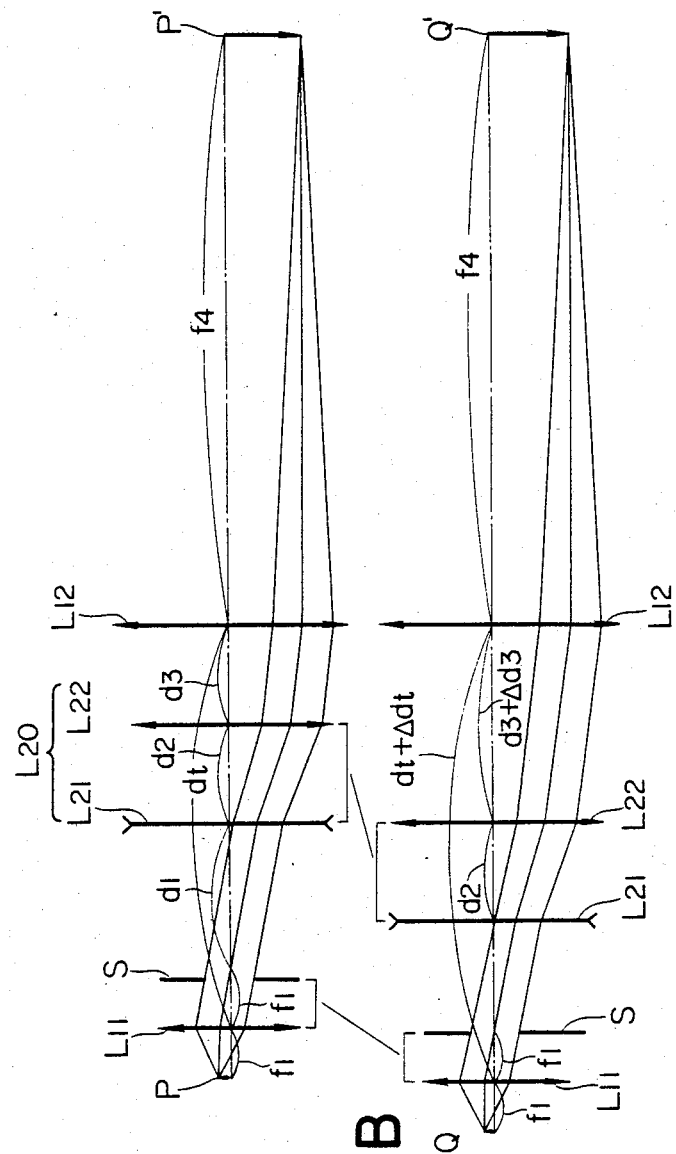

FIGS. 3A and 3B show the construction of a first embodiment of the present invention in which a telecentric optical system always maintaining telecentricity on the object side and the image side is formed by the use of the aforedescribed four-unit system. In FIG. 3, lens units functionally similar to those of FIG. 2 are given similar reference characters. Here, a stop S is provided on the rearward focus of the first positive lens unit $L_{11}$, namely, the focus of the afocal system $L_{20}$ side, and the first positive lens unit $L_{11}$ and the stop S are movable together and the afocal system $L_{20}$ comprising the negative lens unit $L_{21}$ and the positive lens unit $L_{22}$ can be operatively associated with the first lens unit $L_{11}$. Thus, as shown in FIG. 3A, the image P' of the object P on the forward focus of the first positive lens unit $L_{11}$ is formed on the rearward focus of the second positive lens unit $L_{12}$ spaced apart by $f_1 + dt + f_4$, and if, as shown in FIG. 3B, the first positive lens unit $L_{11}$ and the stop S are moved forward by $\Delta dt$ and the afocal system is moved forward by $\Delta d_3$, the image Q' of an object Q positioned forwardly of the object P by $\Delta dt$ is formed on the rearward focus of the second positive lens unit $L_{12}$ spaced apart by $f_1 + dt + \Delta dt + f_4$. Accordingly, if the second positive lens unit $L_{12}$ is fixed, both the images of the objects P and Q will be formed at a predetermined position which is the rearward focus of the second positive lens unit $L_{12}$ while telecentricity is maintained on both the object side and the image side. The image magnification is invariable as shown by equation (4). That is, it is possible to form an image at a fixed position at a predetermined magnification while maintaining telecentricity on both sides relative to not only the objects P and Q but also objects at any positions.

FIGS. 4A and 4B show the construction of a second embodiment of the present invention. In this embodiment, the afocal system $L_{20}$ is composed of two positive lens units $L_{23}$ and $L_{24}$, but yet has an operational effect similar to that of the embodiment shown in FIGS. 3A and 3B. Again in this case, the first positive lens unit $L_{11}$ and the stop S provided on the rearward focus thereof are movable together and the afocal system $L_{20}$ is movable in association with these. Of course, in this case, the spacing $d_2$ between the two positive lens units constituting the afocal system $L_{20}$ is equal to the sum of the focal lengths of these lens units. By moving the first positive lens unit $L_{11}$ and the stop S together from the conjugate condition of the object P and its image P' as shown in FIG. 4A and at the same time, operatively associating the afocal system $L_{20}$ therewith, the erect image Q' of the object Q located at a different position as shown in FIG. 4B can be formed at the same position as the erect image P' of the original object P and moreover, telecentricity is maintained on both the object side and the image side. The image magnification also is constant. Accordingly, again in this, it is possible to form an image at a fixed position at a constant magnification while maintaining telecentricity on both sides relative to objects at any positions.

In this manner, telecentricity is always maintained on the object side and therefore, even if the surface of the object has concavo-convexity, there is no magnification change resulting from the blur of the image and thus, accurate measurement of the size of the object can be accomplished and accuracy is ensured for aligning of objects. Also, telecentricity is always maintained on the image side and therefore, the image magnification is kept constant, and these characteristics are effective in case light is received by an image pick-up tube or CCD (charge coupled device). If the image plane is constant, it is not at all necessary to move an eyepiece or an image pick-up device for observation of the object and this leads to the possibility of making the mechanism very simple and compact. Further, the fact that the magnification remains constant irrespective of any change in object position is very convenient to the measurement of the object.

Now, as will be seen from the comparison between the first embodiment of FIGS. 3A and 3B and the second embodiment of FIGS. 4A and 4B, these two embodiments are opposite to each other in the direction of movement of the afocal system $L_{20}$ relative to the movement of the first positive lens unit $L_{11}$. This is not attributable to the difference that the afocal system of the first embodiment is the so-called Galilean type and the afocal system of the second embodiment is the so-called Kepler type, but is dependent on which of the absolute values of the focal lengths of the two lens groups constituting the afocal system $L_{20}$ is greater. That is, as can be seen from the aforementioned equation (3), where $|f_2| < |f_3|$, the signs of $\Delta dt$ and $\Delta d_3$ are coincident and, where $|f_2| < |f_3|$, the signs of $\Delta dt$ and $\Delta d_3$ are opposite to each other and thus, the direction of movement of the afocal system $L_{20}$ relative to the first positive lens group is determined by the magnitude relation between $|f_2|$ and $|f_3|$, i.e., the absolute values of the focal lengths of the two lens units constituting the afocal system $L_{20}$.

A third embodiment shown in FIGS. 5A and 5B is of a construction in which the object surface and the image plane are orthogonal to each other. A first positive lens unit $L_{11}$, a stop S and a reflecting mirror M are provided integrally with an objective lens barrel 1, and an afocal system comprising a negative lens unit $L_{21}$ and a positive lens unit $L_{22}$ is provided in an afocal lens barrel 2. The objective lens barrel 1 and the afocal lens barrel 2 are operatively associated with each other in the direction of the optical axis of a second positive lens unit $L_{12}$. By the objective lens barrel 1 and the afocal lens barrel 2 being moved from a condition in which, as shown in FIG. 5A, the image P' of an object point P on a sample 3 is formed on the rearward focus of the second positive lens unit $L_{12}$, the image Q' of a different object point Q on the sample 3 is formed on the rearward focus of the second positive lens unit $L_{12}$, as shown in FIG. 5B. Accordingly, by operatively associating the objective lens barrel 1 and the afocal lens barrel 2 with each other, the image of any object point of the sample 3 can be formed at a fixed position. Of course, in this case, the amount of movement $\Delta dt$ of the objective lens barrel 1 and the amount of movement $\Delta d_3$ of the afocal lens barrel 2 satisfy the aforementioned equation (3). As in the previous embodiment, telecentricity is always maintained on the object side and the image side and the image magnification is invariable. A Kepler type afocal system comprising two positive lens units being provided in the afocal lens barrel 2 would also result in a similar effect.

In the foregoing, there have been described embodiments in which telecentricity is always maintained on both the object side and the image side even if the distance between the object and its image changes, and the fact that telecentricity is maintained on both sides is nothing but the fact that the pupil positions on the object side and the image side of this optical system, namely, the positions of the entrance pupil and the exit pupil, are both always at infinity. That is, the term "double conjugate" used herein means that two conjugate relations, i.e., the conjugate relation between the object and its image and the conjugate relation between the pupils, are maintained. There will be described hereinafter a case where at least one of the pupil positions on the object side and the image side is at a finite distance.

Figures 6A, 6B:
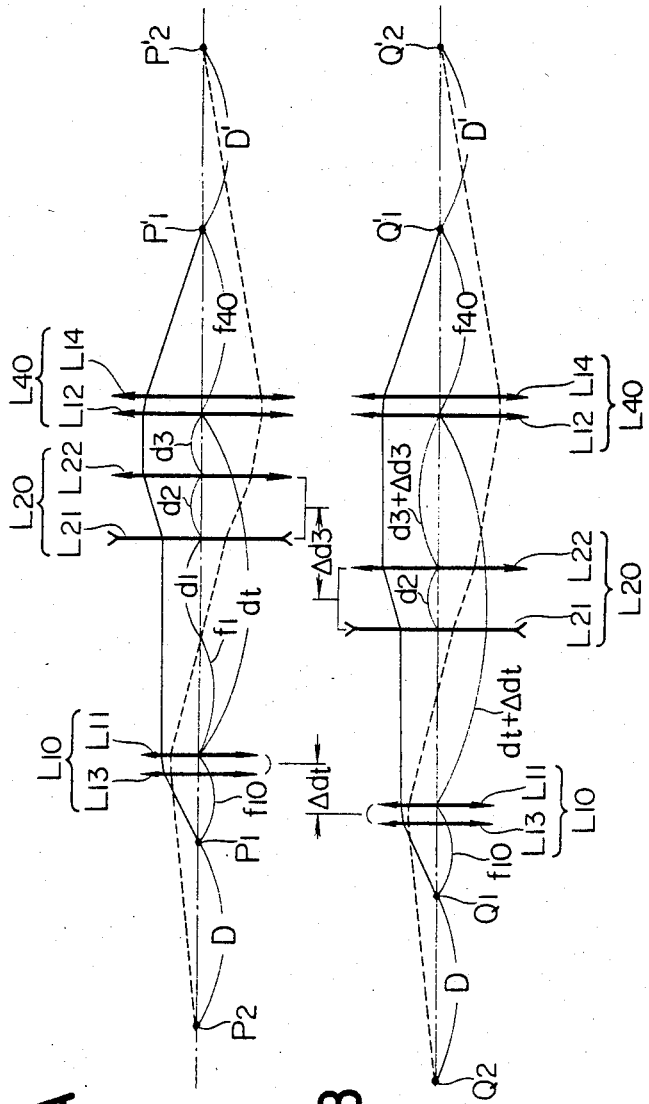

FIGS. 6A and 6B show the construction of a fourth embodiment in which the pupils on the object side and the image side are both at finite distances. In FIG. 6A, the conjugate relation with respect to an object $P_1$ and the object side pupil $P_2$ is shown and, in FIG. 6B, the conjugate relation with respect to an object $Q_1$ and the object side pupil $Q_2$ is shown. In each of these Figures, the light ray representative of the conjugate relation between the object and its image is indicated by solid line and the light ray representative of the conjugate relation between the pupils is indicated by dotted line. In these Figures, functionally similar members are given similar reference characters to clarify the relation with the principle of the present invention described in connection with FIGS. 2A and 2B and make it readily understood. Here, in order to locate the positions of the object side and image side pupils at finite distances, the first positive lens unit $L_{10}$ is comprised of a lens unit of stronger refractive power consisting of the first positive lens unit $L_{11}$ of FIG. 2 and an additional positive lens unit $L_{13}$, and the second positive lens unit $L_{40}$ also is comprised of a lens unit of stronger refractive power consisting of the second positive lens unit $L_{12}$ of FIG. 2 and an additional positive lens unit $L_{14}$. Each of the first and second positive lens units $L_{10}$ and $L_{40}$ is substantially a single positive lens, but for better understanding, each of them is shown as comprising two lens units. It is to be understood that the first lens unit $L_{10}$ comprises two positive lenses $L_{13}$ and $L_{11}$ combined together by a thin, intimate contact system and has a focal length $f_{10}$ and that the second positive lens unit $L_{40}$ comprises two positive lenses $L_{12}$ and $L_{14}$ combined together by a thin, intimate contact system and has a focal length $f_{40}$.

As shown in FIG. 6A, the image $P_1'$ of an object $P_1$ located on the forward focus of the first positive lens unit $L_{10}$ is formed on the rearward focus of the second positive lens unit $L_{40}$ because the system between the first positive lens unit $L_{10}$ and the second positive lens unit $L_{40}$ is a parallel optical system and at the same time, the object side pupil $P_2$ forward of the object $P_1$ by a distance D is conjugate with the image side pupil $P_2'$ rearward of the object image $P_1'$ by a distance D'. The magnification $\beta$ of the image $P_1'$ relative to the object $P_1$ is given by $$\beta = \frac{f_2 f_{40}}{f_{10} f_3}, \tag{5}$$

where $f_2$ and $f_3$ are the focal lengths of two lens units $L_{21}$ and $L_{22}$, respectively, constituting the afocal system $L_{20}$. When, as shown in FIG. 6B, the first positive lens unit $L_{10}$ is then moved by $\Delta dt$ and the afocal system $L_{20}$ is moved by $\Delta d_3$ in association therewith, the image $Q_1'$ of another object $Q_1$ spaced apart from the object $P_1$ by $\Delta dt$ is formed on the rearward focus of the second positive lens unit $L_{40}$, and the object side pupil $Q_2$ exists at a distance D from said another object $Q_1$ and this is conjugate with the image side pupil $Q_2'$ rearward of the object image $Q_1'$ by a distance D'. The then image magnification is the same as equation (5). The then relation between $\Delta dt$ and $\Delta d_3$ is the same as equation (3). In this manner, the distance between the object and its image can be changed by a variation in full length of the lens and at this time, the object side and image side pupils lie at predetermined positions spaced apart from the object and the image, respectively, by a distance D and a distance D' respectively, and the image magnification also is maintained constant.

Figures 7A, 7B:
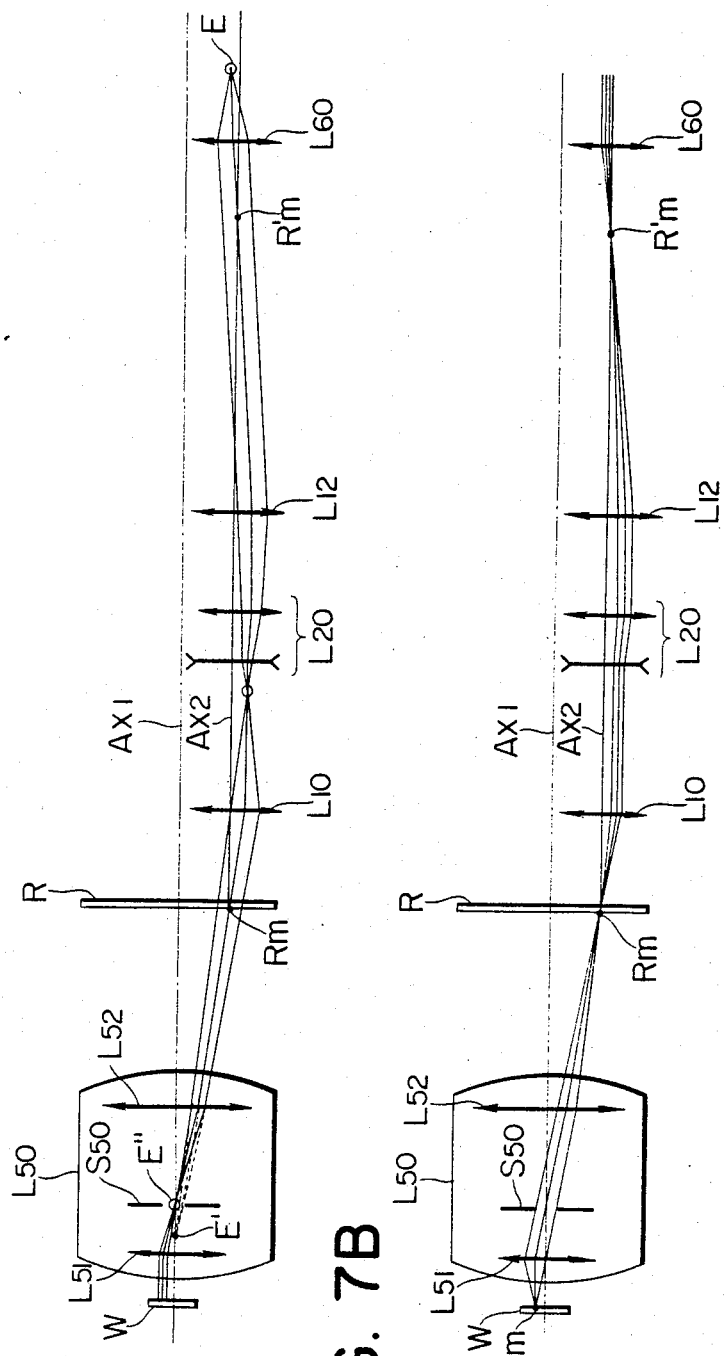

FIGS. 7A and 7B show the construction of a fifth embodiment in which the fourth embodiment shown in FIG. 6 is applied to the alignment optical system of a projection type exposure apparatus used for the manufacture of integrated circuits such as LSI or VLSI. A wafer W and a reticle R are disposed at conjugate positions at a predetermined magnification with respect to a projection objective lens $L_{50}$. The reticle R is uniformly illuminated by an illuminating optical system, not shown, so that the pattern of the reticle R is projected and printed upon the wafer W. The projection objective lens $L_{50}$ comprises equivalently two positive lens units $L_{51}$ and $L_{52}$ and a stop $S_{50}$ provided therebetween. The projection objective lens $L_{50}$ is usually designed to be a telecentric system on the wafer W side and for this reason, the stop $S_{50}$ is disposed on the focus of the wafer side positive lens group $L_{51}$. It is with the alignment optical system according to the present embodiment that the aligned condition of the positions of the wafer W and the reticle R is observed or measured through such a projection objective lens $L_{50}$. This alignment optical system comprises a first positive lens unit $L_{10}$, an afocal system $L_{20}$, a second positive lens unit $L_{12}$, a third positive lens unit $L_{60}$ and a light source E for alignment. The first positive lens unit $L_{10}$ and the afocal system $L_{20}$ are functionally similar to those in the aforedescribed fourth embodiment, and the reticle R is disposed in coincidence with the forward focal plane of the first positive lens unit $L_{10}$. The second positive lens unit $L_{12}$ is identical to that in the first to third embodiments and is telecentric on the image side. The third positive lens unit $L_{60}$ is for supplying the light beam from the light source E as a parallel light beam. The alignment mark Wm on the wafer W and the reference mark Rm on the reticle R are provided in the marginal portion of a predetermined exposure pattern and therefore, as shown, the optical axis Ax2 of the alignment optical system is disposed with a deviation corresponding to the distance of the reference mark Rm from the center of the reticle R with respect to the optical axis Ax1 of the projection objective lens $L_{50}$. In FIG. 7A, there is shown a light ray representative of the conjugate relation with respect to the pupils of the alignment optical system, and the reticle R side pupil position of the alignment optical system is coincident with the entrance pupil position of the projection objective lens $L_{50}$. That is, the image E" of the light source E is formed at the entrance pupil position of the projection objective lens $L_{50}$, that is, the image E" of the light source is formed at the position of the stop $S_{50}$ of the projection objective lens $L_{50}$ and thus, so-called Keller illumination is effected. The projection objective lens $L_{50}$ and the alignment optical system are eccentric and therefore, the light source E also is disposed eccentrically from the optical axis Ax2 of the alignment optical system and thus, it is a parallel beam system which is strictly not telecentric on the image side of the second positive lens unit $L_{12}$ but has a slight angle with respect to the optical axis. In FIG. 7B, there is shown a light ray representative of the conjugate relation of the object, namely, the reference mark Rm on the reticle R, with respect to the alignment optical system, and the manner in which the reference mark Rm on the reticle R and the image R'm of the reference mark formed at the rearward focus position of the second positive lens unit $L_{12}$ are imaged can be seen. The image of the alignment mark Wm on the wafer W is projected upon the position of the reference mark Rm by the projection objective lens $L_{50}$ and the secondary image of the alignment mark Wm on the wafer W is also formed at the position of the image R'm of the reference mark, and the aligned condition of the positions of the wafer W and the reticle R may be observed and measured from these images.

In this alignment optical system, when the reticle R, the projection objective lens $L_{50}$ and the wafer W are moved relative to the alignment optical system, the first positive lens unit $L_{10}$ is moved by the same amount, whereby the forward focus of the first positive lens unit $L_{10}$ can be made coincident with the reticle R and also, by operatively associating the afocal system $L_{20}$ therewith so as to satisfy the relation of equation (3), the image R'm of the reticle can be formed at a predetermined position and the pupil image, namely, the light source image E', can be formed at a predetermined position distant from the reticle R and therefore, Keller illumination is strictly maintained. Accordingly, even if the position of the reticle R changes, the aligned condition of the reticle and the wafer can be observed and measured always at a predetermined position and Keller illumination can always be maintained. The image R'm of the reference mark Rm on the reticle R and the image of the alignment mark of the wafer W can be extracted by inserting a half-mirror into the parallel light beam shown in FIG. 7B, namely, between the first positive lens unit $L_{10}$ and the afocal system $L_{20}$ or between the afocal system $L_{20}$ and the second positive lens unit $L_{12}$ or on the image side of the second positive lens unit $L_{12}$.

A sixth embodiment of the present invention shown in FIG. 8 is an example of the application of the alignment optical system for a projection type exposure apparatus shown in FIG. 7. In FIG. 8, members functionally similar to those of FIG. 7 are given similar reference characters. In this embodiment, a first positive lens unit $L_{10}$ and a reflecting mirror M10 are integrally provided within an objective lens barrel 10 which is movable parallel to the reticle R and along the optical axis. An afocal lens barrel 20 integrally having an afocal system constituted by two lens units $L_{21}$ and $L_{22}$ is movable along the optical axis in operative association with the the objective lens barrel 10. The wafer W and the reticle R are disposed conjugately with respect to a projection objective lens $L_{50}$, and the pattern on the reticle R is projected upon the wafer W by illuminating light 50 supplied from a main illuminating device, not shown. The images of the alignment mark Wm on the wafer W and the reference mark Rm on the reticle R are formed on the image pick-up surface 6a of an image pick-up tube 6 through the reflecting mirror M10, first positive lens unit L₁₀, afocal system L₂₁, L₂₂, second positive lens unit L₄₀ and half-mirror M₂₀. Also, the light beam from a light source E passes through a third positive lens unit L₆₀ and is reflected by a reflecting mirror M30 and half-mirror M₂₀ and passes to the reticle R and wafer W, and the image E" of the light source E is projected upon the position of the stop S50 of the projection objective lens L₅₀ by the second positive lens unit L₄₀, afocal system L₂₂, L₂₁, first positive lens unit L₁₀ and reflecting mirror M10 and thus, Keller illumination is effected. In such a construction, when the reticle R is replaced with another reticle and the position of the reference mark Rm for alignment is changed, the objective lens barrel 10 may be moved so that the reference mark Rm is positioned on the forward focus of the first positive lens unit L₁₀ and at the same time, the afocal lens barrel 20 may also be moved, whereby the image R'm of the reference mark Rm and the image of the alignment mark Wm on the wafer W can be formed on the image pick-up surface 6a of the image pick-up tube 6 without the other members being moved, and also the image E" of the light source E can be formed at the position of the stop of the projection objective lens L₅₀ and thus, Keller illumination can be completely maintained.

Figure 9:
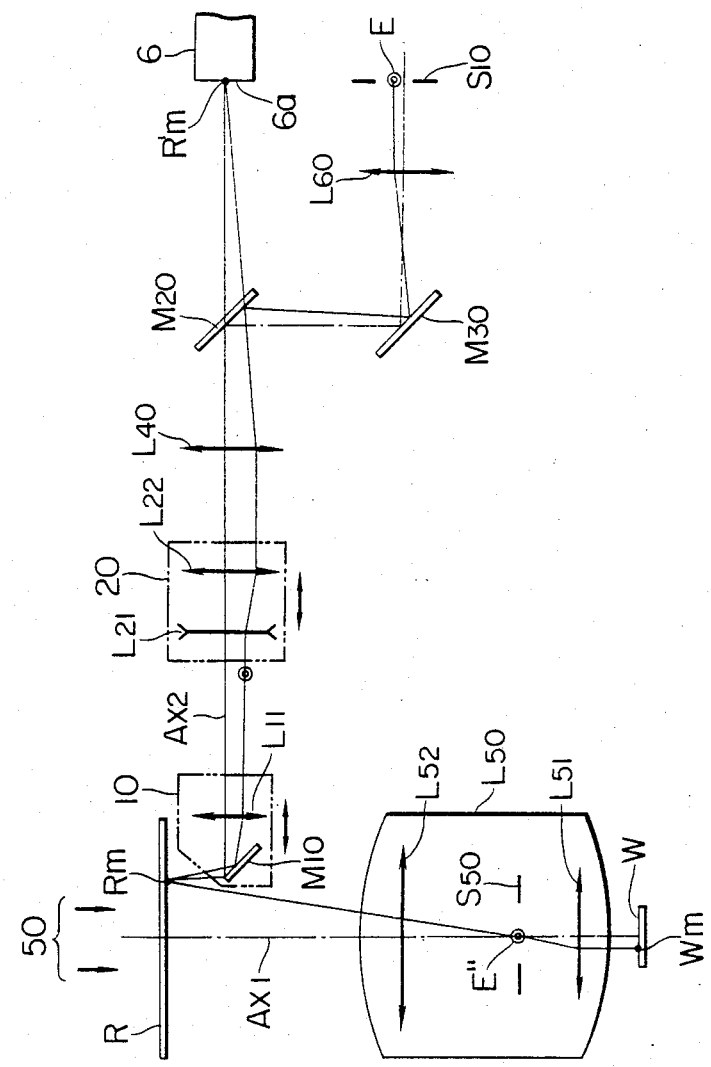

A seventh embodiment shown in FIG. 9 is basically similar in construction to the sixth embodiment shown in FIG. 8, but differs from the latter in that the reference mark Rm on the reticle R and the alignment mark Wm on the wafer W are observed by means of reflected light on the reticle R. Again in this Figure, functionally similar members are given similar reference characters. Again in this construction, when the position of the reference mark Rm on the reticle R changes, the objective lens barrel 10 and the afocal lens barrel 20 are moved in operative association with each other, whereby the images of the reference mark Rm and alignment mark Wm can be formed on the image pick-up surface 6a and it is possible to continue to maintain Keller illumination. In the above-described sixth and seventh embodiments, substantially as in the fifth embodiment, the optical axis Ax2 of the alignment optical system is eccentric relative to the optical axis Ax1 of the projection objective lens L₅₀. Therefore, in order that the light source image E" may be formed at the center of the stop of the projection objective lens L₅₀, it is desirable that the light source E be provided at a location spaced apart from the optical axis Ax2 of the alignment optical system, as shown in FIGS. 7, 8 and 9. It is also effective that with the movement of the objective lens barrel 10, the light source E is also moved in a direction perpendicular to the optical axis Ax2, but if the light source E is made into a surface light source having some degree of size like the exit surface of optical fiber, it will also be possible to fix it. Further, the position of the light source E on the optical axis is predetermined and therefore, by a variable stop S10 for changing the shape of the light source being provided at the position of the light source E as shown in FIGS. 8 and 9, the size and shape of the light source image in the pupil plane of the projection objective lens can be changed and the alignment mark on the wafer can be observed in its optimum condition. Even if the reticle is replaced with another reticle and the position of the reference mark and the position of the alignment mark are changed, the imaging magnification is kept constant in the alignment optical system according to the present invention and therefore, the magnification of the light source image formed in the pupil plane of the projection objective lens is constant. The light source E may be the exit surface of optical fiber, or instead of the light source E, there may of course be disposed a light source image by a separate relay lens system.

FIGS. 10A and 11A schematically show the construction of an eighth embodiment in which the double-conjugate maintaining optical system according to the present invention is applied to the alignment system of a projection type exposure apparatus. FIG. 10A shows a case where the reticle R is relatively small, and FIG. 11A shows a case where the reticle R' is relatively large. This embodiment is such that in the construction of the previously described sixth embodiment (FIG. 8), a rectangular stop 70 for forming a rectangular opening 70a is provided as light source means, and in FIGS. 10A and 11A, members functionally similar to those shown in FIG. 8 are given similar reference characters.

The rectangular opening 70a formed by the slit-like rectangular stop 70 provided in the light source portion is disposed so that the lengthwise direction thereof corresponds to the direction of movement of the focus position of the first positive lens unit L₁₀, namely, in this case, the radial direction of the reticle R, whereby the image of the rectangular opening 70a is formed at the entrance pupil position of the projection objective lens L₅₀ so that the lengthwise direction thereof is coincident with the meridional direction. FIGS. 10B and 11B show the entrance pupil plane of the projection objective lens L₅₀, and it is seen in these Figures that the image I_F' of the opening surface of the light source portion and the image 70a' of the rectangular opening 70a are formed in overlapping relationship with the entrance pupil I_E of the projection objective lens L₅₀. FIGS. 10C and 11C show the opening surface of the light source portion, and it is seen in these Figures that the rectangular opening 70a exists in the opening surface I_F and the image I_E' of the entrance pupil of the projection objective lens L₅₀ is formed in overlapping relationship therewith. In each of these Figures, the hatching indicates the area in which illuminating light is present. When, as shown in each of these Figures, the objective lens barrel 10 and afocal lens barrel 20 in the alignment system are moved with a variation in size and the reticle, the image 70a' of the rectangular opening of the light source portion moves lengthwisely thereof relative to the entrance pupil I_E in the entrance pupil plane of the projection objective lens L₅₀ while, on the other hand, the image I_E' of the entrance pupil of the projection objective lens L₅₀ moves over the rectangular opening 70a lengthwise thereof in the opening surface of the light source portion. Accordingly, both in the entrance pupil plane of the projection objective lens L₅₀ and in the opening surface of the alignment system, the rectangular opening 70a or its image 70a' and the entrance pupil I_E of the projection objective lens or its image I_E' only move relative to each other lengthwise of the rectangular opening 70a and therefore, little or no variation occurs to the condition in which the alignment mark Wm on the wafer W is illuminated through the projection objective lens L₅₀. This is because, as shown in FIGS. 10B and 11B, the ratio D/φ_E of the diameter φ_E of the entrance pupil I_E to the width D of the rectangular opening image 70a' is always kept constant and this is equal to the fact that the sigma value of the rectangular opening in the widthwise direction thereof (the ratio σ of N.A. of the illuminating system to N.A. of the projection objective lens) is constant. As regards the lengthwise direction of the rectangular opening, the sigma value always is considerably greater than 1 and the illuminated condition in this direction is hardly varied even by movement of the alignment optical system. In such a construction, by changing the width of the slit-like rectangular opening 70a formed by the rectangular stop 70, it is possible to change the sigma value in the widthwise direction.

FIG. 12 is a perspective view schematically showing the construction of the light source portion used in FIGS. 10A and 11A. The light beam from a light source 71 is made into a substantially parallel light beam by a condenser lens 72 and condensed on a rectangular stop 70 by a second condenser lens 73, whereby an enlarged image of the light source is formed on the rectangular stop 70. As the construction of the light source portion, it is also possible to adopt a construction as shown in FIG. 13 wherein the light beam from a light source 71 is condensed by a condenser lens 72 and directed by an optical fiber bundle 74, whose exit side portion 74a is made into a rectangular shape, and a substantially rectangular opening is formed by the exit end 70a' thereof.

Figure 14:
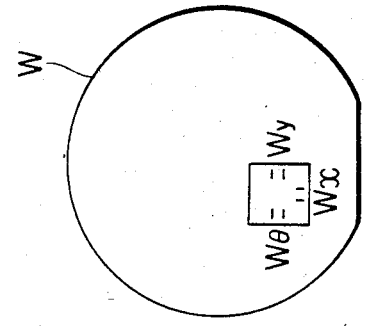
FIGS. 14 and 15 are plan views of a reticle and a wafer, respectively, used in an embodiment of the present invention.
Figure 15:
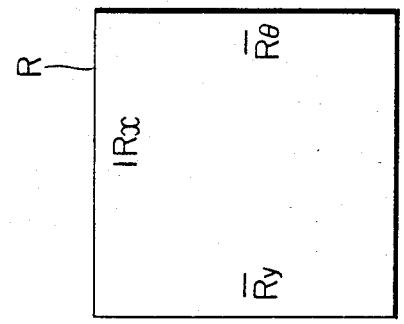
Figure 16:
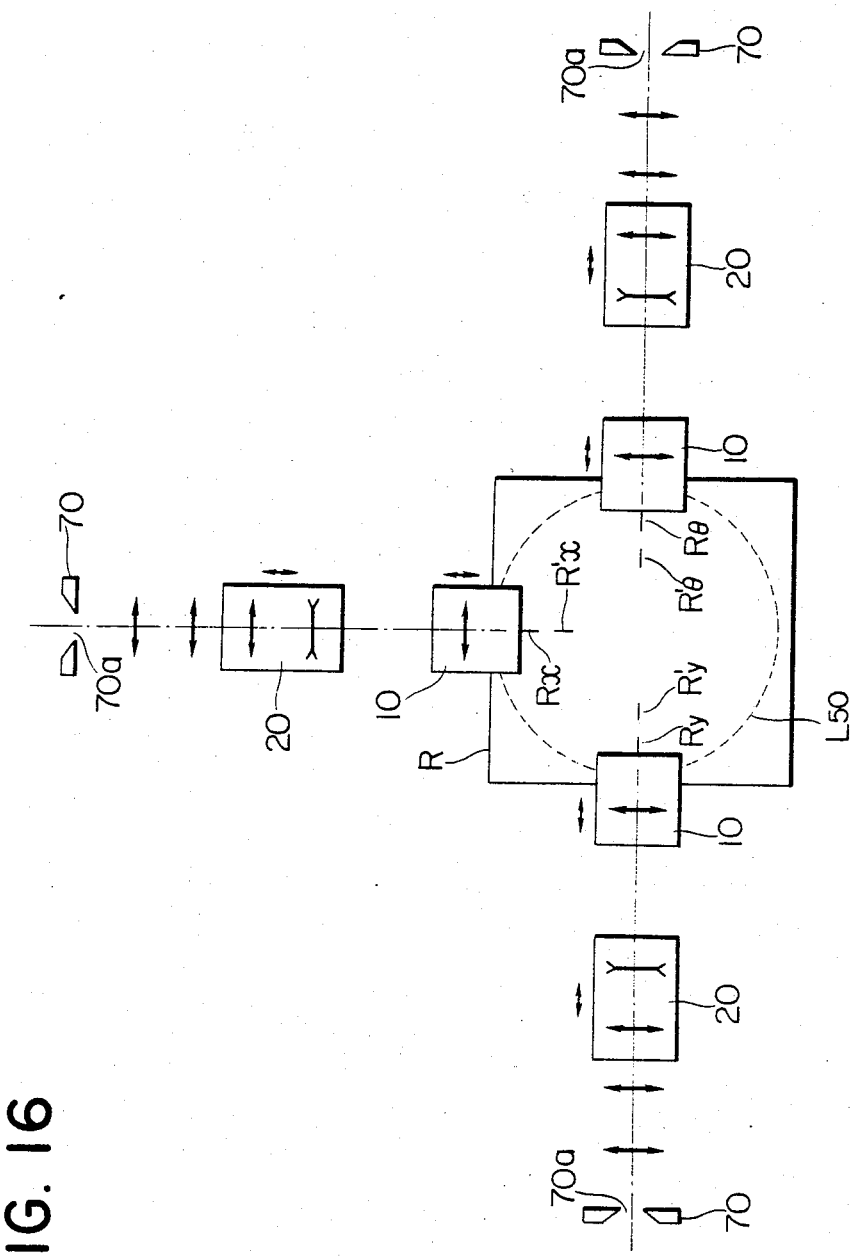
FIG. 16 is a schematic plan view of a projection type exposure apparatus using an alignment optical system in accordance with the present invention.

According to the above-described construction of the alignment optical system, the lengthwise direction of the rectangular opening corresponds to the radial direction of the reticle, i.e., the meridional plane, and the sigma value in the sagittal direction perpendicular to the radial direction is kept constant and therefore, if the reference mark on the reticle and the alignment mark on the wafer are made rectilinear in the radial direction, i.e., in the meridional direction, the images thereof can be formed always with a predetermined resolving power. FIG. 14 is a plan view of a reticle on which three radial reference marks Rx, Ry and R$_\theta$ are provided in directions orthogonal to one another, and FIG. 15 is a plan view of a wafer on which radial alignment marks Wx, Wy and W$_\theta$ are provided. Relative alignment of these reticle and wafer is accomplished by three alignment optical systems as shown in FIGS. 10A and 11A which are provided relative to the three reference marks Rx, Ry and R$_\theta$ on the reticle R with their optical axes orthogonal to one another, as shown in the plan view of FIG. 16. That is, by effecting alignment of the three reference marks with the respective alignment marks on the wafer through the projection objective lens, the reticle and wafer can be disposed in a predetermined relationship. When the reticle is replaced with another reticle having a small effective area for exposure in order to change the exposure area and the reference marks Rx', Ry' and R$_\theta$' on the reticle are moved more toward the center as indicated by dotted line in FIG. 16, the objective lens barrel 10 and the afocal lens barrel 20 in each of the three alignment systems are moved radially of the reticle R as previously described, whereby the same illuminated condition as that before the replacement of the reticle is maintained. That is, in the respective alignment systems, the lengthwise direction of the rectangular opening 70a formed by the rectangular stop 70 (in FIG. 16, the direction perpendicular to the plane of the drawing sheet) in coincident with the radial direction of the reticle R, namely, the meridional plane of the projection objective lens L$_{50}$ and therefore, the sigma value in the sagittal direction of the projection objective lens L$_{50}$ is constant and the image of each mark in the radiation direction is formed always with a predetermined resolving power. In this manner, the reticle and wafer are completely aligned relative to the directions x and y and rotation. Three systems for the direction x, the direction y and rotation, respectively, have been provided as the alignment systems, but if the design is such that the amount of rotation is also detected by one of the directions x and y, the wafer and reticle can be aligned by only two alignment systems.

According to the alignment optical system of such construction, even when the size of the reticle varies, the images of the reference marks of the reticle and the alignment marks of the wafer can be formed at predetermined positions simply by moving a certain member and the condition of Keller illumination can always be maintained and moreover, the sigma value in the widthwise direction of the rectangular aperture stop can be kept constant. Accordingly, for example, the images of the radial reference marks on the reticle and the radial alignment marks on the wafer can be formed always with a predetermined high resolving power and thus, alignment of high accuracy is always possible.

We claim:

1. A double-conjugate maintaining optical system for maintaining the conjugate relation between an object and its image in a predetermined constant magnification and also maintaining the conjugate relation between an entrance pupil and an exit pupil in a predetermined condition even if the distance between said object and said image varies, including:

an afocal system comprising two lens units disposed with a constant spacing therebetween corresponding to the sum of the focal lengths thereof, said afocal system being movable along the optical axis thereof while maintaining the constant spacing between said two lens units;

a first positive lens unit disposed on the object side of said afocal system; and a second positive lens unit disposed on the image side of said afocal system;

said first positive lens unit being movable relative to said second positive lens unit along the optical axis thereof so that said object is positioned on the focal plane of said first positive lens unit opposite to said afocal system;

said afocal system being movable relative to said second lens unit along the optical axis thereof in a predetermined relation to the amount of relative movement of said first positive lens unit with respect to said second positive lens unit.

2. The optical system according to claim 1, wherein when the focal lengths of the two lens units in said afocal system are f$_2$ and f$_3$ in succession from the object side, said first positive lens unit and said afocal system are movable so that the amount of movement $\Delta dt$ of said first positive lens unit relative to said second positive lens unit and the amount of movement $\Delta d_3$ of said afocal system relative to said second positive lens substantially unit satisfy the following relationship $$\Delta dt = \left(1 - \frac{f_2^2}{f_3^2}\right) \Delta d_3.$$

3. The optical system according to claim 2, further having a stop member disposed at the focus position of said first positive lens unit which is adjacent to said afocal system, said stop member being movable along the optical axis with said first positive lens unit, whereby even if the distance between the object and its image changes, the conjugate relation between said object and said image is maintained and the conjugate relation between the object side pupil and the image side pupil is maintained in a predetermined condition.

4. The optical system according to claim 3, wherein at least one of said object side pupil and said image side pupil is formed always at infinity position and telecentricity is maintained on at least one side.

5. The optical system according to claim 4, further having a reflecting member between said stop member and said afocal system, an objective lens barrel integrally supporting said reflecting member, said first positive lens unit and said stop member, and an afocal lens barrel supporting said afocal system, said objective lens barrel and said afocal lens barrel being movable along the same optical axis relative to said second positive lens unit, an image of any object point on the object side focal plane of said first positive lens unit being formed on the image side focus of said second positive lens unit and moreover, telecentricity on at least one of the object side and the image side being maintained even though there is variation of the distance between said first positive lens unit and said second positive lens unit.

6. The optical system according to claim 5, wherein the two lens units of said afocal system are a negative lens unit and a positive lens unit.

7. The optical system according to claim 5, wherein both of the two lens units of said afocal system are positive lens units.

8. In a projection type exposure apparatus for projecting a pattern on a reticle onto a wafer by means of a projection objective lens, an alignment optical system for observing the positional relation between a reference mark on said reticle and an alignment mark on said wafer through said projection objective lens, thereby effecting alignment of said reticle and said wafer, said alignment optical system including:
   an afocal system comprising a plurality of lens units;
   a first positive lens unit disposed on the side of said afocal system which is adjacent to said reticle and a second positive lens unit disposed on the side of said afocal system which is opposite from said reticle, the reticle side focus of said first positive lens unit being substantially coincident with the reference mark on said reticle;
   light source means having a light source for supplying illuminating light onto said reticle through said second positive lens unit and further onto said wafer through said projection objective lens; and
   means for observing therethrough the image of the reference mark on said reticle and the image of the alignment mark of said wafer projected by said projection objective lens;
   said first positive lens unit and said afocal system being movable along the optical axis in a predetermined relation, said first positive lens unit being moved so that when the position of the reference mark on said reticle changes, said reference mark is positioned on the reticle side focus of said first positive lens unit, and said afocal system being moved therewith; the position of said reference mark image and the magnification thereof being maintained constant and the image of said light source being formed always at the entrance pupil position of said projection objective lens even though there is a positioning change of the reference mark of said reticle.

9. The alignment optical system according to claim 8, wherein said afocal system has two lens units and when the focal lengths of the two lens units in said afocal system are $f_2$ and $f_3$ in succession from the reticle side, said first positive lens unit and said afocal system are movable so that the amount of movement $\Delta d_t$ of said first positive lens unit relative to said second positive lens unit and the amount of movement $\Delta d_3$ of said afocal system relative to said second positive lens unit substantially satisfy the following relationship $$\Delta d_t = \left(1 - \frac{f_2^2}{f_3^2}\right) \Delta d_3.$$

10. The alignment optical system according to claim 9, further including a reflecting member disposed between said first positive lens unit and said reticle, said reflecting member being movable integrally with said first positive lens unit.

11. The alignment optical system according to claim 10, wherein said light source means has a rectangular opening at the position of said light source or at a position conjugage with said light source, and the lengthwise direction of said rectangular opening corresponds to the direction in which the reticle side focus of said first positive lens unit is movable on said reticle with respect to said second positive lens unit.

12. An optical apparatus for forming, at a fixed position, an image of any object point on an object surface, comprising:
   a first positive lens unit for converting a light beam from one object point on the object surface to a parallel light beam, said first positive lens unit being movable along the object surface for converting a light beam from another object point on the object surface to a parallel light beam;
   a second positive lens unit for converging the parallel light beams converted by said first positive lens unit; and
   compensating means disposed between said first positive lens unit and said second positive lens unit for maintaining parallel light beams at both the incident side and the exit side of said compensating means so as to fix the image position and image magnification of said one object point and said other object point on said object surface and for also maintaining a constant conjugate condition with respect to entrance and exit pupils of said optical apparatus, even though there is movement of said first positive lens unit,
   said compensating means including an optical unit movable relative to said second positive lens units in a predetermined relation to the amount of the movement of said first positive lens unit.

13. An optical apparatus according to claim 12, further comprising a reflecting member disposed between said object surface and said compensating means and movable along the object surface integrally with said first positive lens unit.

14. An optical apparatus according to claim 13, wherein said optical unit of said compensating means includes two optical elements integrally movable relative to said second positive lens unit in proportion to the amount of relative movement of said first positive lens unit and said second positive lens unit.

15. An optical apparatus according to claim 14, wherein said two optical elements are a negative lens member and a positive lens member disposed with a spacing therebetween corresponding to the sum of the focal length of said negative lens member and that of said positive lens member.

16. An alignment optical system according to claim 14, wherein said two optical elements are two positive lens members disposed with a spacing therebetween corresponding to the sum of the focal lengths thereof.

17. In a projection type exposure apparatus for projecting a pattern on a reticle onto a wafer by means of a projection objective lens, an alignment optical system for detecting the positional relation between a reference mark on said reticle and an alignment mark on said wafer through said projection objective lens, thereby effecting alignment of said reticle and said wafer, said alignment optical system including:
  a first positive lens unit for converting a light beam from the reference mark on said reticle to a parallel light beam;
  a second positive lens unit for forming an image of said reference mark on said reticle at a rear focal plane thereof;
  said first positive lens unit and said second positive lens unit being movable relative to each other;
  compensating means disposed between said first positive lens unit and said second positive lens unit, for maintaining a conjugate condition between the reticle and the rear focal plane of said second positive lens unit in a predetermined constant magnification and for also maintaining a constant conjugate condition with regard to entrance and exit pupils of said alignment optical system, even though there is relative movement of said first positive lens unit and said second positive lens unit, said compensating means having an optical unit movable relative to said second positive lens unit in a predetermined relation to the amount of relative movement of said first positive lens unit and said second positive lens unit.

18. An alignment optical system according to claim 17, wherein said first positive lens unit is movable with respect to said projection objective lens and said second positive lens unit is fixedly disposed with respect to said projection objective lens, and wherein said compensating means maintains the conjugate position of said exit pupil of said alignment optical system substantially at an entrance pupil position of said projection objective lens in spite of the movement of said first positive lens unit.

19. An alignment optical system according to claim 18, further comprising light source means for forming an image of a light source at said exit pupil position of said alignment optical system.

20. An alignment optical system according to claim 19, wherein
  said optical unit of said compensating means includes two optical elements integrally movable relative to said second positive lens unit in proportion to the amount of relative movement of said first positive lens unit and said second positive lens unit.

21. An alignment optical system according to claim 20, wherein said two optical elements are a negative lens member and a positive lens member disposed with a spacing therebetween corresponding to the sum of the focal length of said negative lens member and that of said positive lens member.

22. An alignment optical system according to claim 20, wherein said two optical elements are two positive lens members disposed with a spacing therebetween corresponding to the sum of the focal lengths thereof.

* * * * *